United States Patent [19]

Lockett

[11] 4,239,118

[45] Dec. 16, 1980

[54] SORTING APPARATUS HAVING AUTOMATIC NULLING ARRANGEMENT

[75] Inventor: James F. Lockett, Houston, Tex.
[73] Assignee: Geosource Inc., Houston, Tex.
[21] Appl. No.: 874,780
[22] Filed: Feb. 3, 1978
[51] Int. Cl.³ .............................................. B07C 5/342
[52] U.S. Cl. .................................... 209/581; 209/582; 250/226; 356/407; 307/350
[58] Field of Search ............... 209/576, 577, 580, 581, 209/582; 356/407; 250/226; 307/350, 352, 362

[56] References Cited

U.S. PATENT DOCUMENTS

| | | | |
|---|---|---|---|
| 2,966,264 | 12/1960 | Cox | 209/581 X |
| 3,373,870 | 3/1968 | Black et al. | 209/582 X |
| 3,382,975 | 5/1968 | Hoover | 209/580 X |
| 3,899,415 | 8/1975 | Codding et al. | 209/581 |
| 3,998,555 | 12/1976 | Babb | 356/407 |
| 4,082,189 | 4/1978 | Cordes | 250/223 R X |

FOREIGN PATENT DOCUMENTS

| | | | |
|---|---|---|---|
| 1345720 | 2/1974 | United Kingdom | 209/580 |
| 1445398 | 8/1976 | United Kingdom | 209/580 |
| 1460527 | 1/1977 | United Kingdom | 209/580 |

*Primary Examiner*—Joseph J. Rolla
*Attorney, Agent, or Firm*—Arnold, White & Durkee

[57] ABSTRACT

Apparatus for sorting articles is characterized by a nulling arrangement which corrects for amplifier offset and drift as the sort occurs. The nulling arrangement samples the amplifier output during a predetermined sample time period to detect the lowest signal output from the amplifier during the sample period. An electrical signal representative of the difference between the lowest detected signal and a predetermined reference signal representative of the light reflected from the background is generated for application as a correction signal to the amplifier. A memory stores the largest correction signal detected during the previous sample period for application to the amplifier during the present sample period. The memory also stores the largest correction signal detected during the present sample period. This present sample is updated if a comparison between the instantaneous correction signal and the stored correction signal are such that the instantaneous correction signal magnitude is larger than the stored correction signal value. If so, the instantaneous correction signal is loaded into the memory and applied to the amplifier during the next-successive sample period. If the instantaneous correction signal is less than the stored correction signal, the stored signal remains in memory and is applied to the amplifier during the next-successive sample period.

13 Claims, 9 Drawing Figures

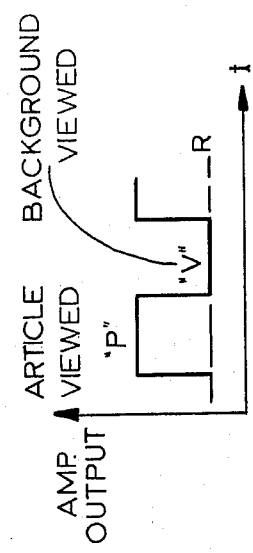
FIG.2A
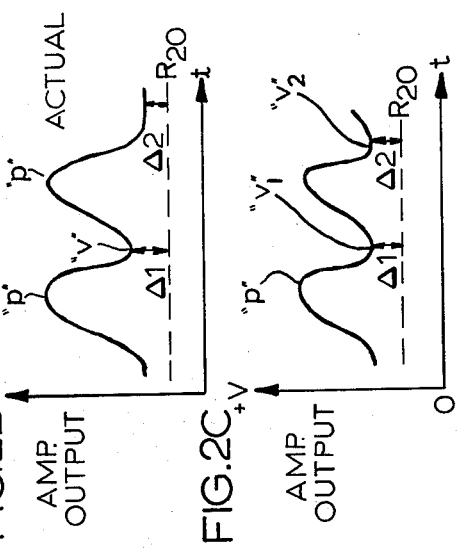
FIG.2B
FIG.2C
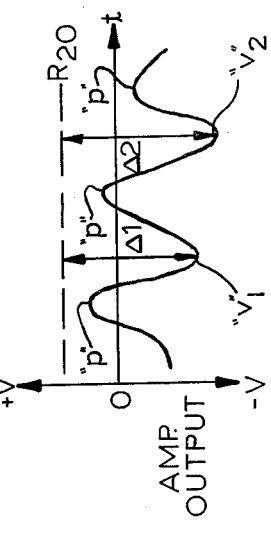
FIG.2D
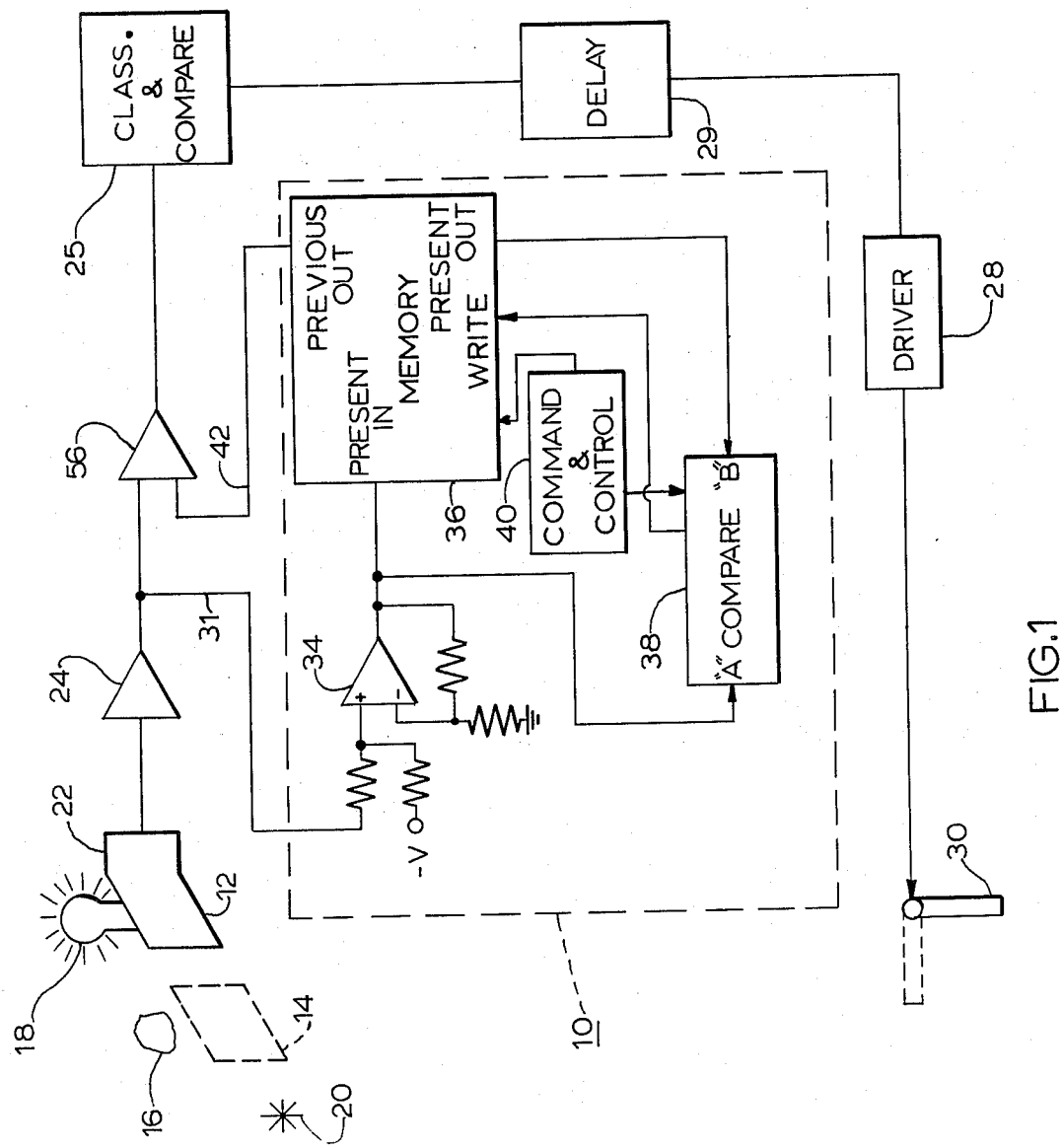
FIG.1

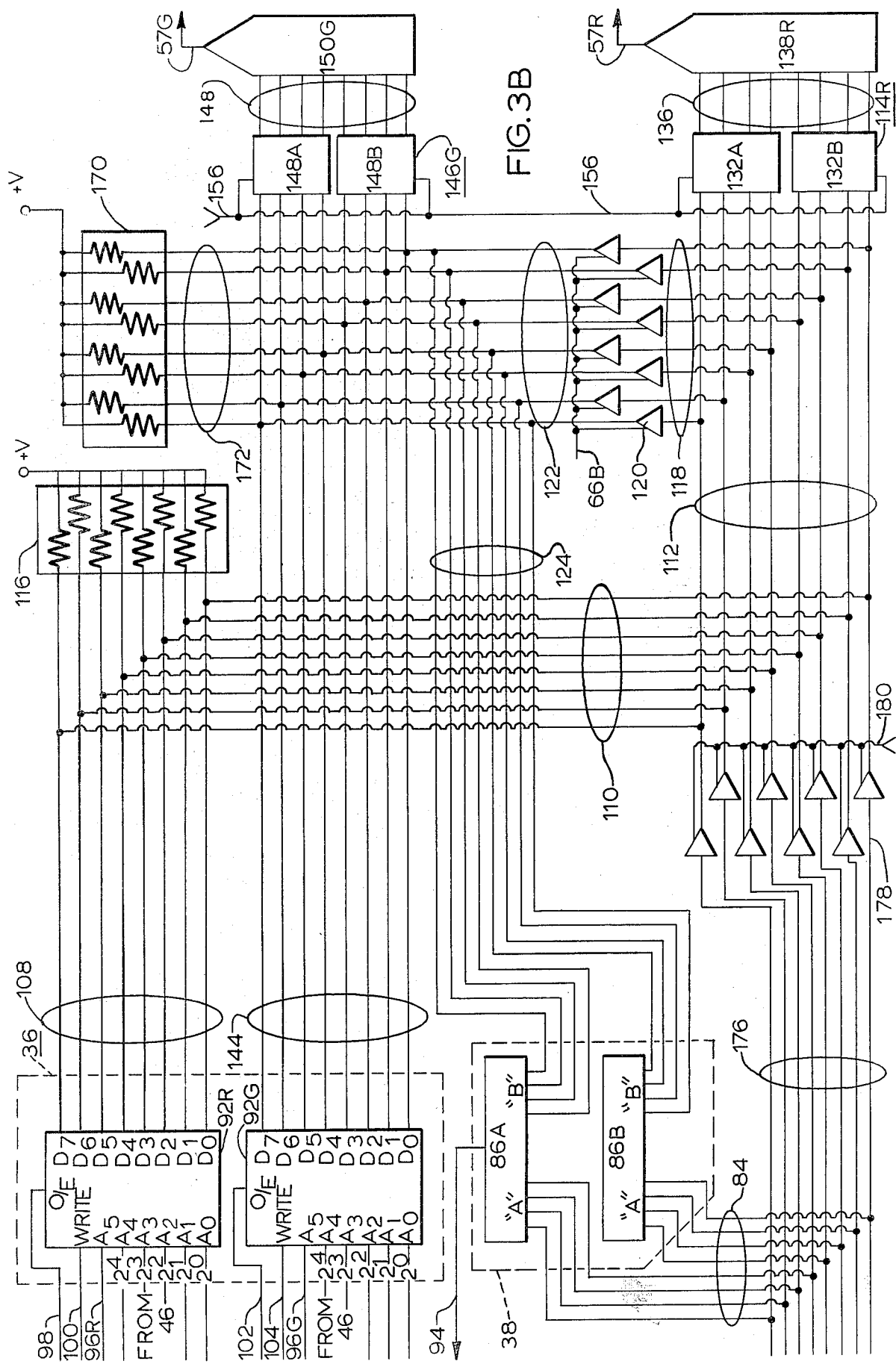

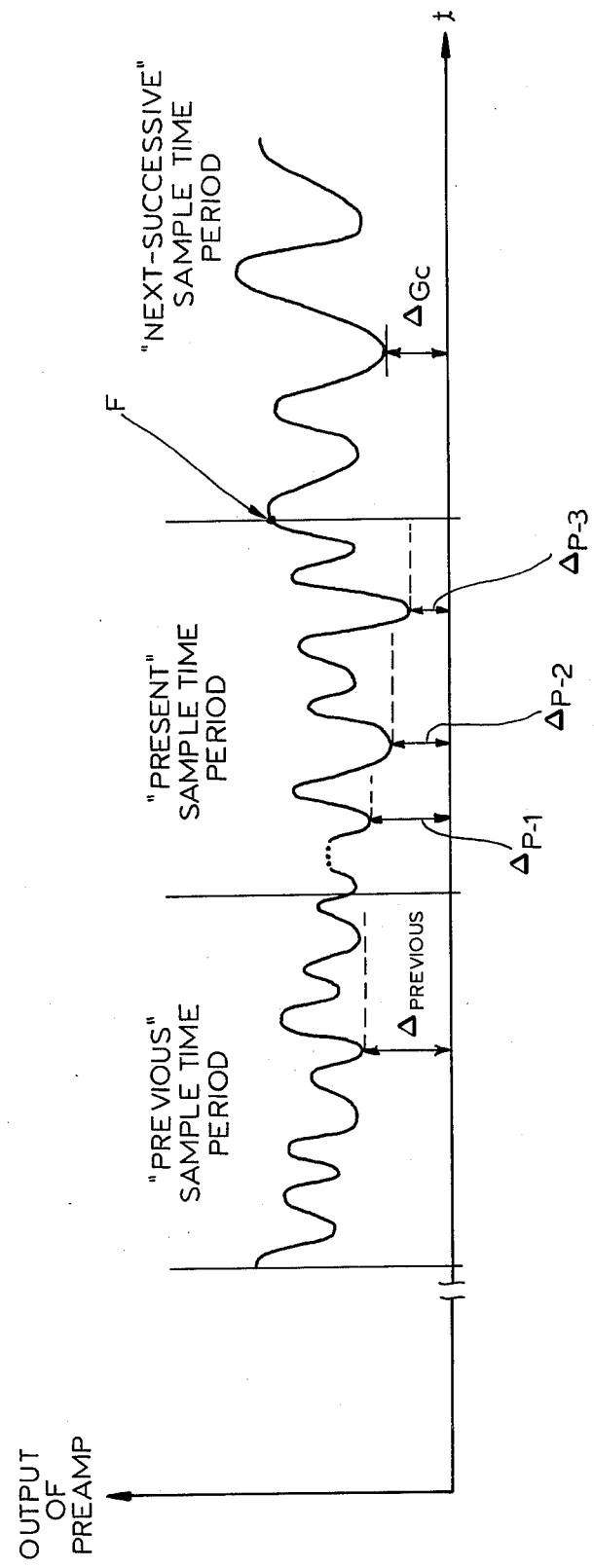

SORTING APPARATUS HAVING AUTOMATIC NULLING ARRANGEMENT

BACKGROUND OF THE INVENTION

1. Field of the Invention

This invention relates to sorting apparatus, and in particular, to sorting apparatus having a nulling arrangement operable to correct for amplifier d.c. offset and temperature drift while a sort is being conducted. The invention is also applicable to electrical circuitry wherein the quiescent state of the circuit lies outside the normal range of signal values generated therein.

2. Description of the Prior Art

It is well-known that electrical components are susceptible to voltage or current fluctuations which mask the true value of electrical signals output therefrom. These deviations are often the product of the operating environment in which the components are placed. For example, operation in elevated-temperature geographical regions and/or operating environments may impart a signal deviation known as temperature drift. Further, mechanical vibration or electrical noise may impart d.c. offset currents or voltages which distort the true component signal output. As a result it is often necessary to correct, or "null", various electrical components to accomodate and correct for d.c. offsets and temperature drifts.

Sorting apparatus for sorting a random stream of articles, such as that disclosed and claimed in the co-pending Application of J. D. P. Jones, E. H. Codding, and M. A. Smither, Ser. No. 704,651, filed July 12, 1976, now U.S. Pat. No. 4,134,498, the co-pending application of J. F. Lockett, Ser. No. 704,652, filed July 12, 1976, now U.S. Pat. No. 4,088,277, and the co-pending application of J. F. Lockett, Ser. No. 704,697, filed July 12, 1976, all assigned to the assignee of the present invention, utilize analog electronic circuit elements which are susceptible to offsets and drifts. The offsets and drifts are believed to be attributable to operating vibration and temperature. In addition, sorting apparatus such as disclosed and claimed in the last-cited co-pending applications are utilized in rugged, in-field environments, where dust, dirt, or humidity may affect the components. Further, spattering of the viewed elements with juices from the articles being sorted as well as glare and extraneous light entering the system also deleteriously affect the integrity of the sort by providing spurious readings from the electronic circuitry.

Since the apparatus disclosed and claimed in the referenced applications accept or reject articles based upon a ratio of two electrical signals representative of light reflected at two predetermined wavelengths, the necessity of assuring the integrity of the signal levels is apparent. Furthermore, various electronic circuit arrangements are associated with the basic sorter configuration which operate to provide other important classification functions. For example, the foreign object and dirt reject arrangement disclosed and claimed in the co-pending application of J. F. Lockett, Ser. No. 829,485, filed Aug. 31, 1977, and assigned to the assignee of the present invention, utilizes the dwell time of a selected signal within a predetermined signal "window" as an indication of the physical characteristic of that article. Thus, if the analog electronic elements associated with the sorting apparatus introduced a spurious reading, it is possible that a foreign object or a dirt clod would generate a signal which would not fall within the defined window. Thus, that foreign object would avoid detection and elimination from the article stream.

Several prior patents have addressed the problem of correcting d.c. offset and temperature drift in electronic components. For example U.S. Pat. No. 3,899,415, issued to E. H. Codding et al. and assigned to the assignee of the present invention, discloses and claims a nulling arrangement adapted to minimize the effects of d.c. offset and temperature drift in a sorting apparatus. However, this patent is typical of prior art arrangements which, although admirably eliminating the effect of such deviations, are usually operable only during a halt in the sorting operation. It would, therefore, be advantageous to provide a nulling arrangement operable while a sort is in progress to correct for the effects of d.c. offset and temperature drifts caused by mechanical vibration, temperature, dirt, dust, foreign material, extraneous glare, or any other reason without the necessity of halting sorting operations.

SUMMARY OF THE INVENTION

This invention relates to an automatic nulling arrangement for correcting for d.c. offset and temperature drifts, spurious signals generated by the presence of dust, dirt, or foreign matter on viewer elements, extraneous light, and glare entering the sorting apparatus optics while the sort is in progress. This invention relates only to sorting apparatus operable to sort articles having light-reflective characteristics falling within a predetermined range of reflectances wherein the light reflected from the articles being sorted is detected against a background having a reflectance characteristic below the predetermined reflectance range. For example, this invention relates to sorting apparatus which detect light reflected from articles being sorted against a non-reflective background, or "black hole".

A nulling arrangement in accordance with the instant invention is characterized by means for sampling the output of an amplifier, susceptible to offset and drift, associated with the optical viewer element to detect the lowest signal level output from the amplifier during a predetermined sample period. An electrical correction signal functionally related to the magnitude of the difference between the lowest detected amplifier output signal and an electrical signal representative of the light intensity reflected from the background (in the case of the "black hole", a zero volt reference) is generated and applied to the amplifier to compensate for detected offset and drift. A partitioned memory is provided to store, in one section, the largest electrical correction signal detected during a preceding sample period for application to the system during the sample period immediately following (the "present" sample period). Another section of the partitioned memory stores the largest correction signal detected during the present sample period. However, the largest stored correction signal is updated during the present sample period if a comparison between the largest stored correction signal and an instantaneous correction signal indicates that the instantaneous correction signal is greater than the stored correction signal. In this manner, the largest correction signal is loaded into the memory for application to the system during the next-succeeding sample period. Thus, during any present sample period, the correction signal applied to the amplifier has been generated during the preceding sample period, with the correction signal to be applied during the next-successive sample period being determined during the present sample period.

The invention may be implemented in either an analog or a digital format and utilized in conjunction with a sorting apparatus that is either multiplexed or nonmultiplexed. Of course, the preferred embodiment utilizes a digitally-implemented automatic nulling arrangement having analog input signals and analog correction output signals therefrom and operative in connection with a multichannel, multiplexed sorting apparatus.

BRIEF DESCRIPTION OF THE DRAWINGS

The invention may be more fully understood from the following detailed description thereof taken in connection with the accompanying drawings, which form a part of this specification, and in which:

FIG. 1 is a generalized block diagram illustrating the functional component elements of an automatic nulling arrangement in accordance with the teachings of this invention and illustrating the interaction thereof with an amplifier connected within a sorting apparatus;

FIGS. 2A–2D are graphical depictions of the principle of operation underlying the automatic nulling arrangement of the present invention;

FIGS. 3A and 3B are detailed schematic diagrams of an automatic nulling arrangement embodying the teachings of this invention in the context of a multichannel, multiplexed sorting apparatus;

FIG. 5 is a graphical illustration of a typical output signal from a preamplifier associated with a predetermined multiplex channel during successive sample periods.

DESCRIPTION OF THE PREFERRED EMBODIMENT

Figure 3A:
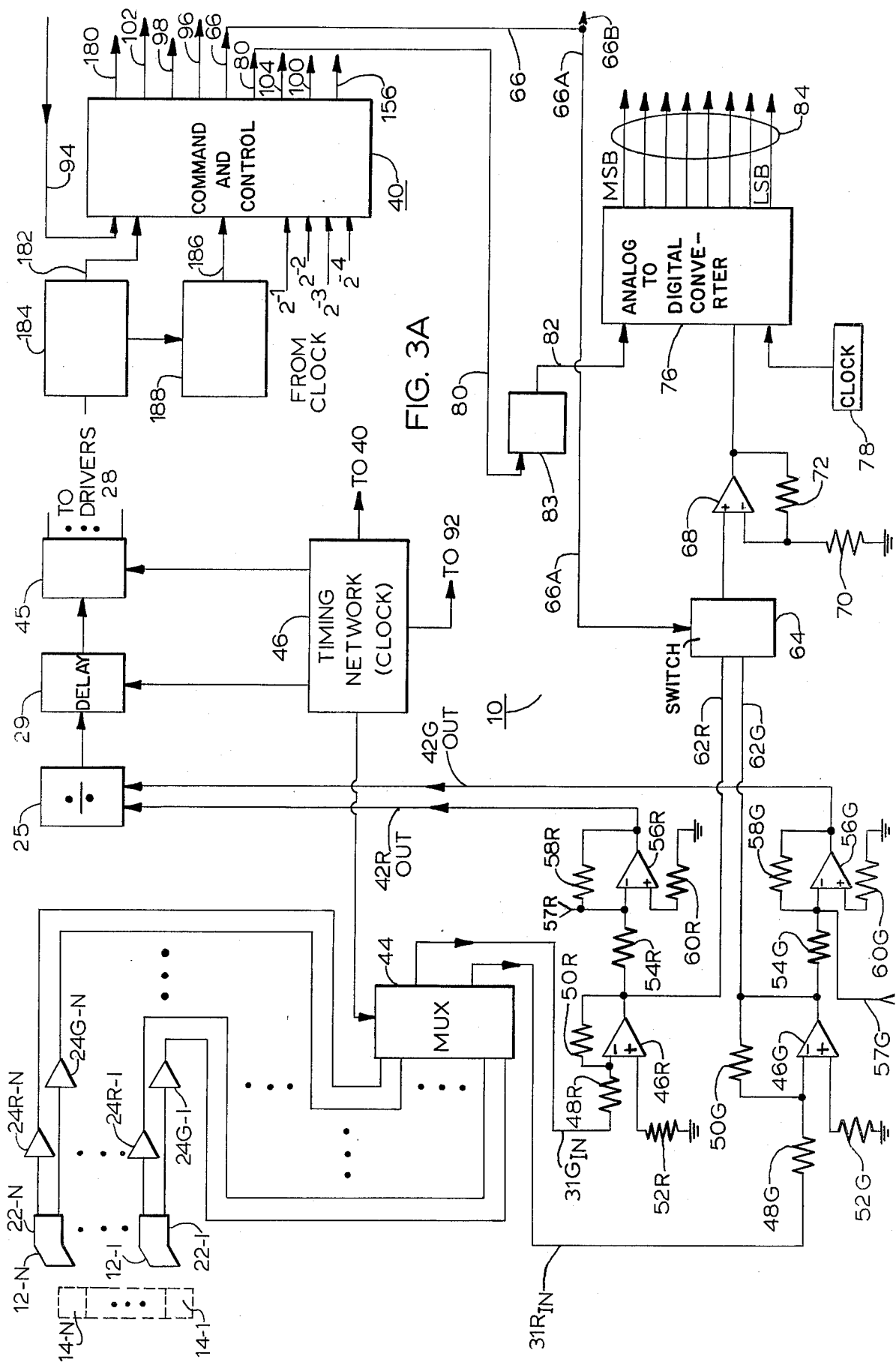

Throughout the following description similar reference numerals refer to similar elements in all figures of the drawings.

With reference to FIG. 1, a generalized block diagram illustration of a portion of a sorting apparatus for classifying and sorting articles based on a predetermined physical characteristic thereof, such as the intensity of light reflected from the articles at predetermined color wavelengths, is illustrated. As is set out more fully herein, an automatic nulling arrangement generally indicated by reference numeral 10 is associated with the sorting apparatus to obviate the effects of d.c. offset and temperature drift occurring in various electronic circuit elements within the sorting apparatus.

The sorting apparatus generally includes a viewer element 12 adapted to optically view a predetermined viewed sector, or zone 14, through which an article 16 to be sorted passes. Depending upon its reflectance characteristic, the article 16 reflects a predetermined amount of light at a predetermined wavelength (dependent upon the color of the article 16) incident thereon from an illumination source 18. The light reflected from the article 16 is detected by the viewer element 12 against a background 20 exhibiting a predetermined reflectance characteristic.

The viewer 12 includes means 22, such as photoelectric cells, for generating an electrical signal output functionally related to and representative of a physical quality of the article being sorted, such as the intensity of the light at a predetermined wavelength reflected from an article 16 within the viewed sector 14 and gathered by the viewer 12. This electrical signal output from the viewer 12 is amplified by a suitable preamplifier element 24 and presented to a classification and comparison network 25. The preamplifier 24 is an electrical amplifier element operable to convert the low signal levels input to it from the photocell transducers to a signal level compatible with electrical manipulation. To accomplish this end, a preamplifier is typically a high gain device. However, the high gain generated by the preamplifier aggravates the d.c. offset and temperature drift problems. It is for the purpose of compensating for signal deviations due to d.c. offset and temperature drift that the preamplifier 24 is associated with an automatic nulling arrangement in accordance with this invention. For a purpose to be discussed more fully herein, a summing amplifier 56 is interposed between the output of the preamplifier element 24 and the classification and comparison network 25. The classification and comparison network 25 is operatively associated with an ejector driver 28 (through a suitable delay (memory) 29) which drives an ejector element 30 extendable into the path of the article and operable to eject an article classified as undesirable from the article stream.

It is critically important to the operation of an automatic nulling arrangement in accordance with this invention that the background 20 possesses a reflectance characteristic which is less than the reflectance characteristic of the articles 16 being sorted. This may best be illustrated and discussed in terms of a specific example. If the articles 16 being sorted are comestibles, such as tomatoes, it is known that such comestible articles reflect a predetermined percentage of the light energy incident thereon. The magnitude of the energy reflected by an article is known as its reflectance. It has been determined that certain comestibles, such as tomatoes, reflect only a predetermined percentage of incident light. Thus, these comestibles exhibit a predetermined range of reflectances. That is to say, a tomato has a reflectance characteristic generally lying in the range of 12 to 50 percent of the total light energy incident thereon.

When a background member 20 having a reflectance characteristic lying outside and below the predetermined range of reflectance characteristics of the articles being sorted is utilized, it has been observed that the presence of an article 16 within the viewed sector 14 reflects light which generates an electrical signal from the photocells 22 associated with the viewer element 12 that is greater than the electrical signal generated when no article is in view. This follows directly from the relative reflectance properties of the articles and the background.

This situation is graphically illustrated in FIG. 2. FIG. 2 is a graphical depiction of the theoretical and actual relative signal intensities at the output of the amplifier element 24 when no article is in view (i.e., light reflected from the background) and when an article is in view. In FIG. 2A, the electrical signal corresponding to light reflected from the background member 20 as generated by the photocells 22 and as amplified by the amplifier 24 may be indicated by a reference value R. Since the reflectance characteristic of the background 20 is outside of and less than the reflectance characteristic range of articles 16 being sorted, any time an article passes through the viewed sector, the light energy reflected from the article and detected by the viewer element 12 exceeds the light reflected by the background. Thus, the passage of an article 16 through the viewed sector 14 appears as a peak "P". When the article exits the viewed sector, the signal output drops to a valley "V". In a perfect world, the signal level of the valley "V" equals the background value "R".

As may be appreciated, however, the analog amplifier element 24 is imperfect and is subject to d.c. offset and temperature drift which may impart bias voltage levels causing the signal at the output of the amplifier 24 to deviate from the expected value of the electrical signals presented when the background and an article are in view. When viewed graphically in FIG. 2, taking into account the effects of amplifier offset and drift and inconsistencies between article reflectances, it may be appreciated that the peaks "p" on the actual signal waveform shown in FIG. 2B represent an article within the viewed sector, while the valleys "v" represent the signal representative of the light reflected by the background 20 when no article is within the viewed sector 14.

Since the "valleys" $v_1$ and $v_2$ do not reach the reference level $R_{20}$, it is readily apparent that the magnitude of the deviation $\Delta 1$, $\Delta 2$ is the instantaneous level of offset and drift of the amplifier 24. Such a conclusion is impelled when the system under consideration utilizes a background 20 having a reflectance less than the reflectance of the articles being sorted.

It should also be pointed out that the magnitude of the voltage peak and valley signals may be positive or negative numbers. An article will generate a greater signal output from the amplifier than will the background. Thus, the lowest signal value on the waveforms is representative of the background output. This is true whether the lowest point on the waveform is a positive number (FIG. 2C), or whether the lowest point on the waveform is a negative number (FIG. 2D). Thus, the largest electrical correction signal is equal to the largest difference between the signal representative of the background and either the lowest positive or highest negative signal value at the instantaneous amplifier output.

The automatic nulling arrangement in accordance with this invention utilizes the graphical relationship discussed above. Since the lowest signal value represents the background signal, deviation between the actual lowest signal value and the reference R must be the deviation occasioned by amplifier offset and drift. Thus, if the lowest actual signal value during a given time period is detected and a signal equal in magnitude but opposite in polarity to the difference between that lowest signal and the reference R is applied to the system through the summing amplifier 56, the effects of temperature offset and drift in the preamplifier 24 may be obviated. This is the basic principle upon which the automatic nulling arrangement 10 in accordance with this invention is predicated.

It is again emphasized that any background 20 having a reflectance less than the reflectances of the articles being sorted may be utilized. If a "black hole" background (zero reflectance) is used, the reference signal value R is, of course, equal to zero volts. In such an instance, the amplifier offset and drift is equal to the deviation $\Delta$. Throughout the remainder of this application, a "black hole" background ($R_{20}$=zero volts) is used.

In accordance with the invention, the automatic nulling arrangement 10 is operatively associated with the preamplifier 24. The nulling arrangement 10 is operable to correct the effects of amplifier d.c. offset, temperature drift, and other deviations imposed by external parameters on the sorting apparatus by generating and applying an electrical correction signal functionally related to the difference between the predetermined reference signal representative of light reflected from the background 20 and the lowest electrical signal output from the viewer during a predetermined sample period.

The nulling arrangement 10 is operative to sample the electrical signal output from the amplifier 24 on a line 31 during consecutive sample time periods of predetermined duration. Any convenient time period e.g., 1 second, may be utilized consistent with the particular circuit configuration of the automatic nulling arrangement. A sample time period is a time segment of predetermined duration during which the largest electrical correction signal is detected and stored for application to the system during the next-successive sample time period. As noted, if the "black hole" reference ($R_{20}$=zero volts) is utilized, the largest correction (i.e., lowest positive value or highest negative value) signal detected in a sample period is equal to the magnitude of the d.c. offset and drift. If other backgrounds are utilized, an amplifier 34 must be provided to generate a difference signal representative of the largest difference between the lowest detected signal and the signal representative of light reflected from the background.

A memory 36 is partitioned into first and second sections, one of which stores the largest electrical correction signal detected during the preceding sample time period for application to the system during the present sample time period. The other memory section stores the largest electrical correction signal (i.e., lowest positive or highest negative, if a "black hole" is used) detected during the present sample period. It is noted that the presently stored correction signal is updated (as discussed herein) if a larger electrical correction signal is detected during the present sample time period.

A comparator 38 is provided for comparing the magnitude of the electrical correction signal stored in the present sample time period section of the memory 36 with the magnitude of the instantaneous electrical correction signal generated during a present sample period. If the instantaneous electrical correction signal is larger than the electrical correction signal stored in the present sample time period section of the memory, an enable signal is generated from the comparator. The memory 36 responds to the enable signal to load the current electrical correction signal. The largest electrical correction signal detected during the present sample time period is applied as an electrical correction signal to the system during the next-succeeding sample time period. A command and control network 40 is provided to output command and control signals to the various functional elements within the automatic nulling apparatus to initiate the operations discussed above.

The automatic nulling arrangement 10 may be implemented in an analog or digital format and may be utilized in connection with a multiplexed or non-multiplexed sorter arrangement. For example, an analog implementation may utilize a peak detector for detecting the largest electrical correction during a given sample time period. (If a reference background other than a "black hole" is utilized, a bias signal representative of the background must be summed with the detected signal). A sample and hold circuit may be used to store the largest electrical correction signal for application to the system during the next-successive time period. In the discussion that follows however, a detailed operative embodiment of an automatic nulling arrangement embodying the teachings of this invention will be described using digital circuit elements and operative in connection with the multiplexed sorting arrangement such as that disclosed and claimed in the three first-referenced co-pending applications.

With reference now to FIG. 3, shown is a portion of a multiplexed sorting apparatus having a plurality N of viewer elements 12 disposed in a side-by-side relationship across the width of a viewed area through which an article stream to be sorted is passed. Each viewer element 12 is adapted to view a predetermined section 14 of the viewed area. Each viewer element 12 has photocells 22 associated therewith for generating electrical signals representative of light at a first and a second predetermined wavelength reflected from an article 16 passing within the sector associated with each viewer. Typically, in the case of a tomato sorting apparatus, electrical signals representative of the intensities of red and green light reflected from an article within a sector are generated by the the associated viewer element 12. Preamplifier elements 24R and 24G are associated with the outputs of each of the photocells 22 (those responsive to red and green relfected light) of the viewers 12. These preamplifiers are susceptible to d.c. offset and temperature drift. The nulling arrangement 10 in accordance with this invention operates to correct for the offset and drift in a manner discussed fully herein.

A multiplexed sampling arrangement 44 samples the electrical signals representative of the intensity of the red and green light reflected from an article passing through the sector associated with each of the viewer elements at the outputs of the preamplifiers 24R and 24G. The N inputs representative of each reflected color are time multiplexed to generate a sequence of electrical signals which are applied to a classification and comparison network 25 including a divider. The ratio of the red and green signal intensities presented sequentially to the divider is used as a basis for classifying the article passing through the sector viewed by a given viewer element as acceptable or unacceptable. The classification signal is stored in a suitable memory (delay 29) location for a predetermined time delay and is then recalled from memory, demultiplexed by a demultiplexer 45, and applied to the appropriate ejector driver 28 which actuates an ejector element 30, associated with the viewer 12 through whose viewed sector an unacceptably colored article was detected, to eliminate that article from the article stream. As is fully set forth in each of the three first-referenced co-pending applications, a suitable timing network 46 is provided which outputs a plurality of binary signals ranging in binary frequency from $2^{-4}$ through $2^{13}$ which are utilized to control the stepping of the multiplexer, the addressing of the memory, and the stepping of the demultiplexer. The basic frequency $2^0$ which controls the time during which each multiplex channel is up and operations performed on the signals sampled thereby is selectable. For a tomato sort, a channel time in the order of 50 microseconds has been found suitable.

It is in connection with the preamplifiers 24R and 24G disposed between the output of photocells 22 and the multiplexer 44 in each channel that the automatic nulling arrangement 10 embodying the teachings of this invention may be advantageously associated. To understand the operation of an automatic nulling arrangement embodying the teachings of this invention in connection with the multiplexed sorting apparatus as disclosed and claimed in each of the three first-referenced co-pending applications, the operations carried out by the automatic nulling arrangement in association with the preamplifiers with a predetermined one of the N multiplexer channels will be set forth. It is understood, of course, that the automatic nulling arrangement operates in an analagous manner during each of the multiplexed channel times.

With reference then to FIG. 3, the automatic nulling arrangement generally indicated by reference numeral 10 is shown as operatively associated with the preamplifiers 24R and 24G. The instantaneous signal output of the preamplifier 24R associated with the electrical signals representative of the magnitude of the light at a predetermined range of red wavelengths reflected from an article being sorted is applied as an input to the automatic nulling arrangement 10 by a line $31R_{IN}$. Similarly, the instantaneous signal output of the preamplifier 24G associated with the electrical signals representative of the magnitude of light intensities at a predetermined range of green wavelengths reflected from an article being sorted is applied as an input to the automatic nulling arrangement 10 by a line $31G_{IN}$.

The analog signals carried on the lines $31R_{IN}$ and $31G_{IN}$ are applied to amplifiers 46R and 46G respectively connected at their inverting inputs through resistors 48R and 48G to the input lines $31R_{IN}$ and $31G_{IN}$. Feedback resistors 50R and 50G are respectively connected between the outputs of the amplifiers 46 and inverting inputs thereof. The values of the resistors 48 and 50 are chosen so as to provide unity gain inverting amplification by the amplifier elements 46. The noninverting inputs of the amplifiers 46 are connected to ground potential through resistors 52R and 52G, as illustrated in FIG. 3.

The outputs of the unity gain inverting amplifiers 46 are respectively coupled through resistors 54R and 54G to the inverting input of operational summing amplifiers 56R and 56G. The summing amplifiers 56 are also provided at the inverting inputs thereof with analog signals representative of the electrical correction factors to be applied to the system to eliminate the effects of offset and drift on signal lines 57R and 57G, respectively. The derivation of the electrical correction signals is discussed more fully herein. It may be noted that the correction signals applied to the summing amplifiers 56 on the lines 57 have been generated during the immediately preceding sample time period. During that preceding sample time period, the largest instantaneous electrical correction signal detected during that sample time period has been stored in a suitable memory location for application to the system during the current sample time period. The output of the summing amplifiers 56 are fed back to the inverting inputs thereof through resistors 58R and 58G, respectively. Furthermore, the noninverting inputs of the summing amplifiers 56 are connected to ground potential through resistors 60R and 60G.

The outputs of the summing amplifiers 56 are connected through output lines $42R_{OUT}$ and $42G_{OUT}$ through appropriate resistors and applied to the classification and comparison network 25. The analog electrical correction signals applied to the system on the lines 42 during any given sample period exhibit a magnitude and a polarity (by the inversion at the summing amplifiers 56) sufficient to compensate for offsets and drifts in the preamplifiers 24R and 24G.

The outputs of the amplifiers 46 are connected by lines 62R and 62G to the inputs of a multiplex switch 64. A suitable multiplex switch for use in accordance with this invention is that manufactured by Siliconix and sold under Model No. 301, although it is understood that any suitable multiplex switch may be utilized. The multiplex switch 64 is operatively associated and responsive to enabling signals from the command control network 40 on a line 66A. The output of the multiplex switch 64 is applied to the non-inverting input of an operational amplifier 68. The inverting input of the amplifier 68 is connected to ground potential through a resistor 70 while the output thereof is fed back to the inverting input through a feedback resistor 72. The resistors 70 and 72 are arranged to amplify the signals presented to a level compatible with the remaining circuit components.

It may thus be appreciated that each time the predetermined one of the N multiplex channels is sampled, an analog voltage signal representative of the instantaneous signal intensity of the light reflected at a predetermined wavelength is presented to the appropriate amplifiers 46R and 46G. Thus, each of the N multiplex channels is sampled by the automatic nulling arrangement 10 embodying the teachings of this invention, and analog electrical signals representative of the instantaneous intensities of light at the selected red and green wavelengths reflected from either the background (no article present) or the article passing within the sector of the viewer element being sampled are serially applied to the amplifier 68 through the multiplex switch 64 operating in response to enabling signals from the command and control network 40. Since the signals present at the output of the amplifier 68 are analog signals, and since several components included within the remainder of the electronic circuitry within the automatic nulling arrangement 10 operate in a digital mode, an analog-to-digital converter 76 is operatively associated with the amplifier 68. A suitable local clock arrangement generally indicated by reference numeral 78 is provided in operative association with the analog-to-digital converter 76. The analog-to-digital converter 76 is operative in response to enabling signals output from the command and control network 40 on lines 80 and 82 connected through a monostable multivibrator element 83. The duration of the output signals from the command and control network 20 are of a length incompatible with the converter 76. Accordingly, the multivibrator 83 generates a pulse of a duration short enough to initiate the operation of the converter 76. A suitable multivibrator is that sold by Texas Instruments under Model No. 74LS123. The output of the analog-to-digital converter 76 is an eight-bit digital signal representative of the instantaneous sampled analog signal present at the output of the preamplifiers 24R and 24G during each multiplex channel time. Due to the action of the multiplex switch 64, it is understood that the analog-to-digital converter 76 is operative to sequentially output eight-bit digital words sequentially representative of the green and the red instantaneous signal intensities (in either order, of course) present at the output of the preamplifiers 24R and 24G each time the selected one of the N multiplex channels here under consideration is called up. A suitable analog-to-digital converter usable in connection with this invention may be that sold by Micronetworks under Model. No. 5141.

The output of the analog-to-digital converter 76 is an eight-bit digital word, the most-significant-bit (MSB) of which is a sign bit, with the remaining bits representative (in digital format) of the sampled red and green instantaneous signal intensities sampled at the outputs of the preamplifiers 24R and 24G, respectively. The digital output of the converter 76 is connected by an array of lines 84 to the "A" side of a digital magnitude comparator arrangement generally indicated by reference numeral 38. The comparator arrangement 38 includes cascaded first and second four-bit digital comparators respectively indicated by reference characters 86A and 86B. Suitable comparators for use in connection with this invention may be those manufactured by Texas Instruments and sold under Model No. 74LS85.

The other side of the digital magnitude comparator 38 is connected in a manner detailed herein to the data output terminals of the memory arrangement generally indicated by reference numeral 36. The memory arrangement 36 may typically comprise first and second random access memory elements 92R and 92G. These memory elements are partitioned, and one partitioned section is utilized to store an electrical correction signal detected during the previous sample time period of the nulling arrangement 10. The other partitioned section of the memory elements 92 is used to store the most current electrical correction signal being generated during the present sample time period for application to the system during the next-successive sample time period. Suitable memory elements for use in connection with this invention are those manufactured by Texas Instruments and sold under Model No. 4036.

The comparator 38 outputs a feedback signal on a line 94 to the command and control arrangement 40 for a purpose discussed herein.

With regard to the memory elements 92R and 92G, each of these elements is respectively input at address terminals $A_0$ through $A_4$ with binary frequency signals $2^0$ to $2^4$ from the clock arrangement 46 used to sequence the operations of the multiplexed sorting apparatus disclosed in any of the three first-mentioned co-pending applications. Each of the memory elements 92 is also addressed at address terminal $A_5$ by an enabling signal output from the command and control arrangement 40 on lines 96R and 96G, respectively. As will be seen, the toggling of the signal on the lines 96 serves to partition the memory elements into the sections discussed above. Further, with regard to the memory element 92R, the output enable terminal thereof is connected to the command and control arrangement 40 by an enabling line 98 while the write terminal is enabled by a signal from the command and control arrangement 40 on a line 100. With regard to the memory element 92G, the output enable terminal thereof responds to an enabling signal from the command and control arrangement 40 carried by a line 102 while the write terminal is enabled from the command and control arrangement 40 by a line 104.

The data terminals of the memory element 92R are connected by an array of lines 108, 110, and 112 to the inputs of a latch 114R. The data terminals of the memory element 92R are also connected to a resistance network 116 which maintains a predetermined logic signal level of the lines in the system when no driving signals are present in the system.

The data terminals of the memory element 92R are also applied to the "B" side of the comparator elements 86A and 86B through an array of lines 118 connected at the input lines 112 of the latch 114, through an array of uni-directional line couplers 120, through an array of lines 122 connected to the outputs of the line couplers 120, and through an array of lines 124 coupled to the output lines 122. The uni-directional line couplers 120 may be any suitable line couplers such as those manufactured by Texas Instruments and sold under Model No. 74LS125. The line couplers 120 are enabled by output signals from the command and control arrangement carried thereto by the output line 66B, that branches from the line 66A which enables the multiplex switch 64.

The latch arrangement 114R may in practice be comprised of quad flip-flop elements 132A and 132B. Suitable circuit elements for use as the latches 132 may be those sold by Texas Instruments under Model No. 74LS175. The output of the latch arrangement is connected by an array of lines 136 to a digital-to-analog converter 138R. A digital-to-analog converter appropriate for use in connection with this invention may be that sold by Motorola under Model No. MC1408L-8. The output of the digital-to-analog converter 138R is connected by a line 57R to the summing amplifier 56R, and a signal of predetermined magnitude (derived as discussed herein) and appropriately inverted to compensate for the polarity of the offset and drift within the preamplifier 24R is applied to the system through the line $42R_{OUT}$.

The data terminals of the memory element 92G are connected by an array of lines 144 to the inputs of a latch arrangement 146G generally comprising first and second quad flip-flop elements 148A and 148B similar to those used in the latch 114R. The output of the latch arrangement 146G is connected by an array of lines 148 to a digital-to-analog converter 150G similar to the converter 138R discussed above. The output of the digital-to-analog converter 150G is connected by a line 57G to the inverting input terminal of the summing amplifier 56G. An electrical correction signal of suitable magnitude and polarity is output from the summing amplifier 56G and connected by a line $42G_{OUT}$ to the system in order to compensate for offset and drift within the preamplifier 24G.

Both the latches 114R and 146G are enabled by an output line 156 connected from the command and control arrangement 40.

The data terminals of the memory element 92G are also connected to a resistor array 170, similar in purpose to the array 116, through an array of lines 172. As seen in the figures, the lines 122 (connected to the output of the line couplers 120), the lines 124 (connected to the input terminals of the comparator 38) and the lines 172 (connected to the resistance arrangement 170) are connected to the lines 144 leading from the data terminals of the memory 92G to the input of the latch 146G.

The output of the analog-to-digital converter 76 is connected by an array of lines 176 to the lines 112 through an array of uni-directional line couplers 178, similar to the line couplers 120 discussed above. The line couplers 178 are enabled by an output signal carried from the command and control arrangement 40 on a line 180.

The command and control arrangement 40 provides output signals to each of the described circuit component elements to initiate the functions performed thereby. The command and control network 40 may be any suitable array of electronic circuit components connected so as to provide enabling signals in the sequence set forth hereafter to the various circuit elements. As noted, the output lines from the command and control network 40 include the lines 66A and 66B (to the multiplex switch 64 and the line couplers 120, respectively), the line 80 (to the analog-to-digital converter 76), the line 96 (to the memory 92 address terminals $A_5$), the lines 98 and 100 (to the data output enable and the write enable terminals, respectively, of the memory element 92R), the lines 102 and 104 (to the data output enable and write enable terminals, respectively, of the memory element 92G), the line 156 (to the latches 146G and 114R), and the line 180 (to the line couplers 178) to thereby enable the operation of each functional grouping of circuit elements.

The command and control network 40 is input with lines carrying timing signals of binary frequencies $2^{-1}$ through $2^{-4}$ output from the multiplex timing arrangement 46, an input line 182 from the sample period signal generator 184, a line 186 from a forced-write signal generator 188, and the control line 94 from the comparator 38.

As discussed, the sample period signal generator 184 is variably operable to output a signal on the line 182 to the command and control network 40 at the termination of each sample time period. Any predetermined suitable sample time period, including time periods of one, two, four, eight, or sixteen seconds, may be used. If a one-second duration sample time period is used with a multiplexed sorting apparatus having 32 channels, each channel with a 50 microsecond duration, it is seen that each of the 32 channels becomes active every 1.6 milliseconds. Thus, there are 625 times during each sample time period that a given multiplex channel is called up. As will be seen, each multiplex channel time for each channel is subdivided into eight "microcycles", during which the described activities occur. The forced-write signal generator 188 is associated with the sample period signal generator 184 and is operative to output a signal to the command and control network 40 on the line 186 during the first multiplex channel time for each multiplex channel immediately following the initiation of a sample time period. In response to the input on the line 186, the command and control network 40 causes a signal representative of the instantaneous signal from the preamplifier to be loaded into the memory location corresponding to each multiplex channel.

OPERATION

Having described the circuit arrangement and component interconnections for an automatic nulling apparatus in accordance with this invention, a description of the operation thereof is now set forth. In this connection, reference is invited to FIGS. 3, 4, and 5, the latter two reference Figures being, respectively, a timing diagram of the interrelationship of the various functions performed by the circuit elements and a generalized waveform output of one of the preamplifiers 24 (either the red or green preamplifier) associated with the predetermined one of the N multiplex channels during successive sample time periods.

It is again noted that a sample time period is a time segment of selectable duration during which the largest electrical correction signal is detected and stored in an appropriately partitioned section of memory for application to the sorting apparatus (particularly the input to the classification and comparison network 25) during the next-successive sample time period.

The largest electrical correction signal (applied during the "next-successive" sample time period) is generated during the "present" sample time period (i.e., the sample time period preceeding the next-successive sample time period) by a series of comparisons between the instantaneous signal present at the output of the preamplifier and the then-current largest electrical correction signal stored in a second partitioned memory section reversed for use during the "present" sample time period. It may be appreciated that during any "present" sample time period, a series of signal comparisons occur between the signal instantaneously present at the output of a given preamplifier when its associated multiplex channel is called up and the then-currently stored largest correction signal. If the instantaneous correction signal exceeds the then-currently stored largest correction signal, the instantaneous signal value is loaded into the addressed memory location. At the end of the "present" sample time period, the largest correction signal detected as a result of the comparisons is applied as the correction signal during the "next-successive" sample time period.

This may be appreciated by reference to FIG. 5; with the assumption that a "black hole" background is used, the magnitude of the correction signal equals the magnitude of the lowest positive signal detected. During the "previous" sample time period, an electrical correction signal equal in magnitude to $\Delta_{PREVIOUS}$ is detected by the automatic nulling arrangement. This correction signal is stored in an appropriately partitioned section of memory, and during the "present" sample time period, the correction signal equal in magnitude to $\Delta_{PREVIOUS}$ is recalled each time the particular multiplex channel is addressed and applied to the system to compensate for preamplifier offset and drift. In addition to applying the correction signal equal in magnitude to $\Delta_{PREVIOUS}$ during each multiplex channel time occurring in the "present" sample time period, a series of comparisons are made to determine the largest electrical correction signal to be generated during the "present" sample time period. These comparisons involve the instantaneous signal and a value representative of the then-current largest correction signal. The then-current correction signal is stored in another partitioned section of memory.

As seen in FIG. 5, after a number of comparisons have occurred, the appropriate memory location in the partitioned memory section utilized for the "present" sample period has stored a then-largest electrical correction signal equal in magnitude to $\Delta_{P-1}$. During a succeeding multiplex channel time in the "present" sample time period, a comparison between the then-currently stored largest correction signal ($\Delta_{P-1}$) and the instantaneous signal at the preamplifiers ($\Delta_{P-2}$) results in the instantaneous signal $\Delta_{P-2}$, after inversion by amplifier 46, being stored in the addressed memory locations. This occurs since the deviation $\Delta_{P-2}$ represents a correction signal larger than the then-currently stored largest correction $\Delta_{P-1}$. The correction signal equal in magnitude to $\Delta_{P-2}$ is stored until a comparision results in a yet-larger correction signal equal in magnitude to $\Delta_{P-3}$ being loaded into memory. At the end of the "present" sample period, the correction signal equal in magnitude to $\Delta_{P-3}$ is loaded into the partitioned memory section used for the previously generated correction and applied to the system during the "next-successive" sample period.

The action of the binary frequency signals $2^{-1}$ through $2^{-4}$ operates to divide each multiplex channel time into eight time subdivisions known as "microcycles". The operations occurring during each microcycle are discussed herein. In practice, it may be necessary to provide suitable time periods within each of the microcycles in which the selected electronic elements may be permitted to settle or to respond to enabling signals. However, in the discussion of the operation that follows, it may be assumed that the operations discussed are active during the full duration of each microcycle. It is also noted in connection with the timing diagram of FIG. 4 that the operations are illustrated in connection with an "active high" logic arrangement whereby the function of a particular circuit element is asserted during the microcycle in which a logic high signal appears on the timing diagram. However, it is understood that, dependent upon the particular circuit component selected to accomplish the designated function, appropriate inversion of signals may be necessary in order to enable the particular component.

During the first four microcycles, the output line 96 from the command and control network 40 connected to the address terminal $A_5$ of each of the random access memory elements 92R and 92G is in a not-asserted state. Electronically, the assertion or non-assertion of the output signal on the line 96 serves to partition each of the memory elements 92R and 92G into memory storage locations utilized to store information for each of the multiplex channels relating to the "previous" sample time period and into memory storage locations utilized in connection with each of the multiplex channels to store information relating to the "present" sample time period, as discussed above. Thus, the assertion or non-assertion of the address terminal $A_5$ in each of the memory elements 92R and 92G on the output line 96 from the command and control arrangement 40, coupled with address signals input to the address terminals $A_0$ through $A_4$ provided from the clock 46, serves to identify a memory storage location associated with each multiplex channel for the "previous" and the "present" sample time periods.

Figure 4:
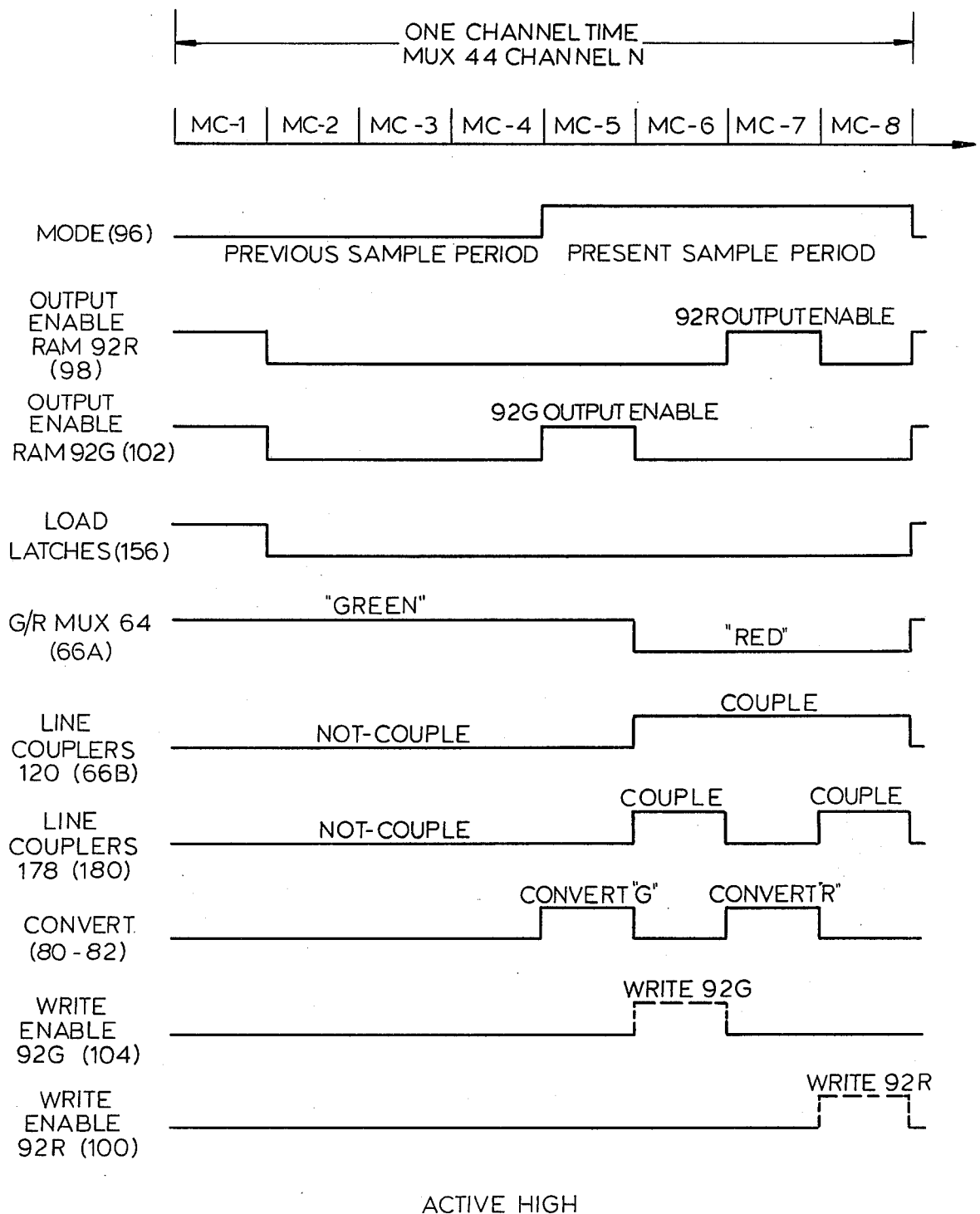
FIG. 4 is a timing diagram indicating the sequence of operation of the automatic nulling arrangement shown in FIG. 3.

During the first microcycle, as seen from FIG. 4, the command and control network 40 enables the output enable terminals on each of the memories 92R and 92G on lines 98 and 102, respectively. Also during the first microcycle, the command and control network 40 outputs an enabling signal on the line 156 to enable the latches 114R and 146G.

Thus, during the first microcycle of each multiplex channel time, a memory storage location in that partitioned memory section relating to the "previous" sample time period is addressed in accordance with the particular multiplex channel being called, and the electrical correction signal generated during the "previous" sample time period (FIG. 5) is recalled from the memory location and loaded into the latches 114R and 146G. In the case of the memory 92R, the signal stored in the addressed location relative to the electrical correction signal generated during the "previous" sample time period is applied by the lines 108, 110, and 112 to the inputs of the latches 132A and 132B disposed within the latch arrangement 114R. In the case of the memory element 92G, data stored in the addressed memory location relative to the electrical correction signal generated during the "previous" sample time period is carried by the array of lines 144 to the inputs of the latches 148A and 148B disposed within the latch arrangement 146G. When each of the latches 114R and 146G are enabled by the enabling signal on the line 156, the electrical correction signals generated during the "previous" sample time period are presented to the digital-to-analog converters 138R (over the array of lines 136) and 150G (over the array of lines 148). The digital electrical correction signals are converted to suitable analog form and presented to the summing amplifiers 56R and 56G over lines 57R and 57G, respectively. The correction signals are summed with the instantaneous signals sampled from the preamplifiers 24 associated with the multiplex channel currently being called, and an appropriate electrical correction signal is applied to the lines leading to the classification and comparison network 25.

At the end of the fourth microcycle, the command and control network 40 outputs an enabling signal on the line 96 to address that partitioned section of the memory element relating to data generated earlier during the "present" sample period. It is during the last four microcycles of each channel time that the nulling arrangement 10 is operative to ascertain and store the largest electrical correction signal for the "present" sample time period for application during the "next-successive" sample time period. For reasons of convenience, operations relative to the green preamplifier 24G occur during the fifth and sixth microcycles while operations relative to the red preamplifier 24R occur during the seventh and eighth microcycles. Consistent with this invention, the multiplex switch 64 is enabled during the fifth microcycle such that the instantaneous signal present at the preamplifier 24G is sampled through the switch 64, amplified by the amplifier 68, and presented to the input of the converter 76. (It is noted that the switch 64 is enabled on the line 66A during the first four microcycles, but no operations are performed thereon during those microcycles.) Simultaneously during the fifth microcycle, the command and control network 40 outputs an enabling signal on the line 80-82 (through the multi-vibrator 83) to assert the operation of the analog-to-digital converter 76. With the converter 76 enabled, the instantaneous signal representative of the analog signal at the preamplifier 24G, after inversion by amplifier 46G, is converted to an eight-bit digital signal appearing at the output terminals of the converter 76. It is noted that the eight-bit digital signal at the output of the converter 76 will remain there until another conversion occurs.

The eight-bit digital signal representative of the inverted instantaneous analog signal at the preamplifier 24G is applied by the lines 84 to the "A" side of the comparator 38 (which includes the cascaded comparators 86A and 86B). Also during the fifth microcycle, it is noted that the output enable terminal of the memory 92G is again asserted on the line 102 from the command and control network 40. Thus, during the fifth microcycle, the largest electrical correction signal generated up to that time during the "present" sample time period is applied on the lines 144 and 124 to the "B" side of the comparator 38. If the instantaneous signal present at the output of the preamplifier 24G after inversion exceeds the then-currently stored largest correction signal (e.g., if inverted signal $\Delta P - 2$ is greater than inverted signal $\Delta P - 1$), the comparator 38 outputs a control signal to the command and control network on the line 94. Further, the command and control network 40 outputs a signal on the line 104 to enable the memory 92G to store the instantaneous correction signal at the addressed memory location. It is emphasized that the write enable signal on the line 104 to the memory 92G is a provisional signal. It is provisional upon the instantaneous correction signal exceeding the stored correction signal during the comparison made during the fifth microcycle. If the comparison is such that during the fifth microcycle a control signal is output to the command and control network 40 on the line 94, then during the sixth microcycle the write enable signal is applied on the line 104 to the memory 92G, and data present at the output of the converter 76 is conducted on the lines 176, through the enabled line couplers 178 (enabled by a signal on the line 180), through the lines 118, through the enabled line couplers 120 (enabled by a signal from the command and control network 40 on the line 66B), through the lines 122 and 144 to the data terminals of the memory 92G.

During the seventh and eighth microcycles of each channel time, activities concerning the instantaneous signal present at the preamplifier 24R occur. During the sixth, seventh, and eighth microcycles, the multiplex switch 64 is enabled by the command and control network on the line 66A. During the seventh microcycle, the command and control network outputs a signal on the lines 80-82 enabling the converter 76 to convert the instantaneous analog signal at the preamplifier 24R, after inversion by amplifier 46R, to an eight-bit digital signal. The eight-bit digital signal representative of the instantaneous signal at the output of the preamplifier 24R, after inversion, is applied to the "A" side of the comparator 38 through the lines 84. Also during the seventh microcycle, the output enable terminal of the memory 92R is again enabled by the line 98 from the command and control network 40. The information stored in an address location within the partitioned memory portion dealing with the "present" sample time period and corresponding to the addressed multiplex channel representative of the then-currently stored largest electrical correction signal is conducted by the lines 108, 110, 112, 118, through the enabled couplers 120 (enabled by a signal on the line 66B), and through the lines 122 and 124 to the "B" side of the comparator 38. The comparator 38 outputs a control signal to the command and control network 40 on the line 94 if the result of the comparison is such that the instantaneous signal at the preamplifier 24R after inversion is larger than the stored signal (e.g., inverted signal $\Delta P - 2$ is greater than inverted signal $\Delta P - 1$). If the inverted instantaneous signal is larger than the then-currently stored signal, a write enable signal is output to the memory 92R on the line 100 from the command and control network 40 during the eighth microcycle. Also during the eight microcycle, the line couplers 178 are again enabled by an output signal carried by the line 180. Thus, the eight-bit digital signal at the output of the converter 76 is conducted by the lines 176, through the enabled couplers 178, through the lines 112, 110, and 108, to the data terminals of the memory 92R. It is again noted that the write enable signal on the line 100 from the command and control network 40 is contingent upon the receipt by the command and control network 40 of a control signal from the comparator 38 indicating that the comparison between the inverted instantaneous and currently-stored signals is true.

At the end of the "present" sample time period, the input signal to the command and control network 40 on the line 182 changes state. This results in a switching of the memory storage locations within the memory elements 92R and 92G. Whatever data that was, until that instant of time, stored in the partitioned memory locations relating to the "present" sample time period immediately becomes stored in the partitioned section of memory relating to the "previous" sample period.

In response to the change of state of the enabling signal on the line 182, the command and control network 40 is input with an enabling signal on the line 186 from the forced-write enabling network 184. During the first multiplex channel time for each of the N multiplex channels following the onset of the "next-successive" sample time period (that is, following the change of state of the signal on the line 182), a forced-write signal is applied to the command and control network 40 on the line 186. As a result, the memories 92R and 92G have loaded thereinto during the first multiplex channel time following the onset of the "next-successive" sample time period a signal representative of the instantaneous preamplifier output. With reference to FIG. 5, for example, in the first multiplex channel time of the Nth channel following the onset of the "next-successive" sample time period, a signal equal in magnitude to the instantaneous signal output from the appropriate preamplifier (point "F") is loaded into the appropriately addressed memory location. Thus, when the state of the change signal on the line 182 changes, indicative of the change from the "present" sample time period to "next-successive" sample time period, the inverted instantaneous preamplifier output is loaded into the appropriate memory location. Thereafter, during each multiplex channel time in the "next-successive" sample time period, a comparison between the instantaneous and stored signals is made in a manner discussed above. At some point during the "next-successive" sample time period, a larger correction signal $\Delta_{Gc}$ is stored in an appropriate memory location. (It is appreciated that during the "next-successive" sample time period, the correction signal equal in magnitude to $\Delta P-3$ is recalled from the appropriate memory location, loaded into the latches, and applied as the offset and drift correction during the first microcycle of each multiplex channel time during the "next-successive" sample time period.) The forced write signal on the line 186 is present only for the first multiplex channel time that each of the N channels comes up following the onset of the new sample time period.

It may be appreciated by those skilled in the art that the forced-writing, after inversion, of the instantaneous signal present at the output of the preamplifier during the first multiplex channel time following the transition of the sample period enabling signal (on the line 182) enables the automatic nulling arrangement 10 embodying the teachings of this invention to asynchronously operate without the necessity of halting sorting operations to null the preamplifiers. It may further be appreciated that by force-writing of the memory locations, "stale" data is not perpetuated in the memory locations.

Having described a preferred embodiment of the invention, those skilled in the art may appreciate that numerous modifications may be effected thereto without departing from the scope of the invention as defined in the appended claims.

What is claimed is:

1. In an apparatus for sorting articles having reflectance characteristics within a predetermined range of reflectances, the sort being based upon the intensity of light reflected from each article as detected against a background having a reflectance below the predetermined range of reflectances, the apparatus including a viewer for viewing an area through which the articles being sorted pass and for generating an electrical signal functionally related to the intensity of light reflected from each article and an amplifier operatively coupled to the viewer for amplifying the electrical signal, the amplifier being susceptible to d.c. offset and temperature drift, the improvement comprising:

a nulling arrangement associated with the amplifier and operable while articles are passing in spaced relation to one another through the area viewed by the viewer for correcting the effects of amplifier d.c. offset and temperature drift by generating and applying an electrical correction signal functionally related to the difference between a predetermined reference signal representative of light reflected from the background and the lowest electrical classification signal output from the viewer during a predetermined sample time period, said sample time period being longer than the time required for an article to pass through the viewed area.

2. The sorting apparatus of claim 1 wherein the background against which articles are detected is a non-reflective background and a reference signal representative thereof is substantially equal to zero volts so that the electrical correction signal is substantially equal in magnitude to the value of the lowest electrical signal output from the amplifier during a predetermined sample time period.

3. The sorting apparatus of claim 1 wherein the background against which articles are detected is a reflective background having a reflectance characteristic outside of and below the range of reflectance characteristics of the articles being sorted and wherein a reference signal representative thereof is substantially equal to a predetermined reference signal, further comprising:

an electrical summing element for generating an electrical correction signal substantially equal to the difference between the lowest electrical signal output from the amplifier during a predetermined sample time period and the predetermined reference signal.

4. In an apparatus for sorting articles having reflectance characteristics within a predetermined range of reflectances, the sort being based upon the intensity of light reflected from each article as detected against a non-reflective background, the apparatus including a viewer for viewing the article being sorted and for generating an electrical signal functionally related to the intensity of light reflected therefrom, an amplifier operatively coupled to the viewer for amplifying the electrical signal, the amplifier being susceptible to d.c. offset and temperature drift, wherein the improvement comprises:

a nulling arrangement associated with the amplifier and operable while articles are being sorted for correcting the effects of amplifier d.c. offset and temperature drift by generating and applying an electrical correction signal the magnitude of which is substantially equal to the value of the lowest electrical classification signal output from the viewer during a predetermined sample time period, wherein the nulling arrangement comprises:

means for sampling the electrical signal from the amplifier during consecutive sample periods of predetermined duration;

a memory for storing a predetermined one of the electrical correction signals applied to the amplifier during a predetermined preceding sample period, the stored signal being recallable from the memory and applied to the amplifier during a predetermined current sample period; and, a comparator for comparing the electrical correction signal generated during the current sample period with the stored signal and for generating an enabling signal if the current correction signal exceeds the stored signal;

the memory being responsive to the enabling signal to store the current signal for application during the next-successive sample period.

5. The sorting apparatus of claim 4 wherein the sampled electrical signal is an analog electrical signal and wherein the memory and the comparator are operable in a digital mode, and further comprising:

an analog-to-digital converter associated with the amplifier for converting the electrical signal into a digital form compatible with the memory and the comparator; and, a digital-to-analog converter connected between the memory and the amplifier for converting the stored correction signal into an analog form compatible with the amplifier.

6. The sorting apparatus of claim 4 wherein the sampled electrical signal is an analog electrical signal further comprising:

a peak detector connected to the output of the amplifier for detecting the lowest electrical signal during each predetermined sample period; and the memory includes a holding circuit having a capacitive element therein for holding the lowest electrical correction for the succeeding sample time period.

7. In an apparatus for sorting a stream of articles randomly disposed across a wide path, the articles having reflectance characteristics within a predetermined range of reflectances, the sort being based upon the intensity of light reflected from each article as detected against a background having a reflectance below the predetermined range of reflectances, the sorting apparatus including a plurality of viewers disposed in a side-by-side relationship across the article path, each viewer viewing a predetermined sector through which a portion of the article stream passes and generating an electrical signal functionally related to the intensity of light reflected from an article passing therethrough, an amplifier operatively coupled to each viewer for amplifying the electrical signal, each amplifier being susceptible to d.c. offset and temperature drift, a multiplexer for sampling the output of each amplifier a predetermined number of channel times during a sample time period of predetermined duration, wherein the improvement comprises:

a nulling arrangement associated with each amplifier through the multiplexer and operable while articles are being sorted to correct the effects of amplifier d.c. offset and temperature drift by generating and applying an electrical correction signal functionally related to the difference between a predetermined reference signal representative of light reflected from the background and the lowest electrical classification signal output from each viewer during a predetermined sample time period.

8. The sorting apparatus of claim 7 wherein the background against which articles are detected is a non-reflective background and a reference signal representative thereof is substantially equal to zero volts so that each electrical correction signal is substantially equal in magnitude to the the value of lowest electrical signal output from each amplifier during a predetermined sample time period.

9. The sorting apparatus of claim 7 wherein the nulling arrangement comprises a memory element having a memory location therein associated with each viewer for storing an electrical correction for the amplifier associated with that viewer generated during a preceding sample time period and means for applying the stored electrical correction signal during each multiplex channel time during the sample time period next-following the preceding sample time period.

10. The sorting apparatus of claim 7 wherein the nulling arrangement comprises a memory element having a memory location therein associated with each viewer for storing therein the largest electrical correction signal generated during preceding channel times within a predetermined sample time period.

11. The sorting apparatus of claim 10 wherein the nulling arrangement comprises a comparator associated with the memory element for comparing the largest electrical correction signal stored in the memory location associated with a predetermined viewer with the instantaneous electrical signal output from that viewer and for storing the instantaneous electrical signal if the instantaneous signal exceeds the stored signal.

12. The sorting apparatus of claim 11 further comprising means for adjusting the duration of the sample time period.

13. The sorting apparatus of claim 12 further comprises means associated with adjusting means and with the memory for storing in the memory location associated with each viewer during the first multiplex channel time following the expiration of a sample time period the electrical signal output from each amplifier.

* * * * *

UNITED STATES PATENT AND TRADEMARK OFFICE
CERTIFICATE OF CORRECTION

PATENT NO. : 4,239,118
DATED : December 16, 1980
INVENTOR(S) : James F. Lockett

It is certified that error appears in the above—identified patent and that said Letters Patent are hereby corrected as shown below:

Col. 7, Line 24 — "the" (second occurrence) should be deleted.

Col. 7, Line 27 — "relfected" should read -- reflected --.

Col. 9, Line 49 — "20" should read -- 40 --.

Col. 11, Line 10 — "which" should read -- that --.

Col. 13, Line 7 — "reversed" should read -- reserved --.

Col. 15, Line 26 — "invention" should read -- convention --.

Signed and Sealed this

Tenth Day of March 1981

[SEAL]

Attest:

RENE D. TEGTMEYER

Attesting Officer    Acting Commissioner of Patents and Trademarks